United States Patent
Rhee

(10) Patent No.: US 7,817,107 B2
(45) Date of Patent: *Oct. 19, 2010

(54) COOLING APPARATUS OF PLASMA DISPLAY PANEL AND METHOD FOR STABILIZING PLASMA DISPLAY PANEL

(75) Inventor: Byung Joon Rhee, Seoul (KR)

(73) Assignee: LG Electronics Inc., Seoul (KR)

( * ) Notice: Subject to any disclaimer, the term of this patent is extended or adjusted under 35 U.S.C. 154(b) by 118 days.

This patent is subject to a terminal disclaimer.

(21) Appl. No.: 12/262,578

(22) Filed: Oct. 31, 2008

(65) Prior Publication Data

US 2009/0122050 A1    May 14, 2009

Related U.S. Application Data

(63) Continuation of application No. 10/301,680, filed on Nov. 22, 2002, now Pat. No. 7,598,938.

(30) Foreign Application Priority Data

Dec. 1, 2001    (KR)    ........................ 10-2001-0075612

(51) Int. Cl.
   *G09G 3/10*    (2006.01)
   *G09G 3/28*    (2006.01)
(52) U.S. Cl. .......................................... 345/41; 345/60
(58) Field of Classification Search .................. 345/41, 345/60
   See application file for complete search history.

(56) References Cited

U.S. PATENT DOCUMENTS

| 5,329,288 | A | 7/1994 | Kim |
| 5,594,463 | A | 1/1997 | Sakamoto |
| 5,854,662 | A | 12/1998 | Yuyama et al. |
| 6,037,921 | A | 3/2000 | Matsumoto et al. |
| 6,061,040 | A | 5/2000 | Onodera et al. |
| 6,175,194 | B1 | 1/2001 | Saegusa et al. |
| 6,359,600 | B1 | 3/2002 | Mijnsbergen et al. |
| 6,376,994 | B1 | 4/2002 | Ochi et al. |
| 6,388,645 | B2 | 5/2002 | Kasahara et al. |
| 6,400,346 | B2 | 6/2002 | Kasahara et al. |
| 6,414,660 | B1 | 7/2002 | Kasahara et al. |
| 6,441,803 | B1 | 8/2002 | Kasahara et al. |
| 6,456,264 | B1 | 9/2002 | Kang et al. |
| 6,509,884 | B2 | 1/2003 | Kasahara et al. |
| 6,630,796 | B2 | 10/2003 | Tokunaga et al. |
| 6,686,698 | B2 | 2/2004 | Takeuchi et al. |
| 6,720,940 | B2 | 4/2004 | Awamoto et al. |
| 6,862,012 | B1 | 3/2005 | Funakoshi et al. |
| 7,079,126 | B1 | 7/2006 | Correa et al. |
| 7,215,316 | B2 | 5/2007 | Sim et al. |

FOREIGN PATENT DOCUMENTS

EP    1162595 A2    12/2001

(Continued)

*Primary Examiner*—Ryan R Yang
(74) *Attorney, Agent, or Firm*—Ked & Associates, LLP

(57) ABSTRACT

A cooling apparatus of a plasma display panel and a method for stabilizing the PDP to minimize the residual image on the display are disclosed. In particular, the present invention minimizes the residual image that is generated due to the degeneration of phosphors caused by a high voltage and a high temperature.

18 Claims, 15 Drawing Sheets

FOREIGN PATENT DOCUMENTS

| | | |
|---|---|---|
| JP | 404284492 | 10/1992 |
| JP | 406251261 | 9/1994 |
| JP | 406251261 A | 9/1994 |
| JP | 410207427 | 7/1998 |
| JP | 10-207426 | 8/1998 |
| JP | 10214045 | 8/1998 |
| JP | 10222076 | 8/1998 |
| JP | 11-19475 | 7/1999 |
| JP | 11-194745 | 7/1999 |
| JP | 2000-040474 | 2/2000 |
| JP | 2000040474 | 2/2000 |
| JP | 2000172191 | 6/2000 |
| JP | 2001326488 A | 11/2001 |
| JP | 2002-304150 A | 10/2002 |
| KR | 2001-0080649 | 8/2004 |

COOLING APPARATUS OF PLASMA DISPLAY PANEL AND METHOD FOR STABILIZING PLASMA DISPLAY PANEL

This application is a continuation of U.S. patent application Ser. No. 10/301,680 filed Nov. 22, 2002 now U.S. Pat. No. 7,598,938, which claims priority to Korean Application No. P2001-75612 filed on Dec. 1, 2002, which are hereby incorporated by reference.

BACKGROUND OF THE INVENTION

1. Field of the Invention

The present invention relates to a plasma display panel, and more particularly, to a cooling apparatus of a plasma display panel (PDP) and a method for stabilizing the PDP by minimizing the residual image on the display.

2. Discussion of the Related Art

Generally, a plasma display panel (PDP) has many advantages suitable for the enlargement of various flat board types of display devices.

Due to the above and other reasons, the (PDP) has drawn a lot of attention to enlargement of the panel size.

As shown in FIG. 1, the most typical form of the (PDP) is the one that includes three-electrode and is driven by AC voltage, which is referred to as an AC surface discharge type PTP.

FIG. 1 is a perspective view of the discharge cell structure of a general 3-electrode AC surface discharge type PDP (or AC PDP of surface discharge type having 3-electrode), and FIG. 2 is a sectional view of the PDP discharge cell of FIG. 1.

With reference to FIGS. 1 and 2, the PDP discharge cell includes a pair of sustain electrodes 14, 16 formed on a front substrate 10, and an address electrode 22 formed on a back substrate 12.

On the front substrate 10 on which the sustain electrodes 14, 16 are formed, there are stacked a front dielectric layer 18 and a protective layer 20.

A back dielectric layer 24 and a barrier rib 26 are formed on the back substrate 12 having the address electrode 22 formed thereon, and phosphors 28 are also formed on the surface of the back dielectric layer 24 and the barrier rib 26.

The front substrate 10 and the back substrate 12 are intervald apart from each other in parallel by the barrier rib 26.

Each of the sustain electrodes 14, 16 has a transparent electrode 14A, 16A formed of transparent electrode material (ITO: Indium Tin Oxide) having a high light transmittance, and a metallic subsidiary electrode 14B, 16B which has the narrower width than that of the transparent electrode 14A, 16A, and is formed of metallic material.

As the transparent electrode material (ITO) has a high resistance value, it cannot transfer the power efficiently. Therefore, the metallic subsidiary electrodes 14B, 16B of material (e.g. silver or copper) having a high conductivity are formed on the transparent electrode 14A, 16A to compensate for the resistant component of the transparent electrode 14A, 16A.

The pair of sustain electrodes 14, 16 are driven to function as a scanning/sustain electrode 14 and a common sustain electrode 16.

To the scanning/sustain electrode 14 are supplied a scanning signal for scanning discharge and a sustain signal for maintenance of the discharge.

To the common sustain electrode 16A is mainly supplied a sustain signal.

A wall charge generated during plasma discharge is accumulated on the front dielectric layer 18 and the back dielectric layer 24.

The protective layer 20 raises the discharge efficiency of secondary electrons as well as expands the life span by preventing the damages of the front dielectric layer 18 caused by the sputtering generated during the plasma discharge. The protective layer 20 is normally made of magnesium oxide (MgO).

The address electrode 22 is formed in the perpendicular direction to the pair of sustain electrodes 14, 16.

A data signal is supplied to the address electrode 22 to select the displayed discharge cells.

The barrier rib 26 is formed in parallel with the address electrode 22, and prevents the ultraviolet light and the visible light generated by the discharge from being leaked to the adjacent discharge cell.

The phosphors 28 are excited by the ultraviolet light generated by the plasma discharge, and emit the visible light, for instance, any one of red, green and blue colors.

Inert gas is injected into a discharge space provided between the two substrates 10, 12 and the barrier rib for the gas discharge.

The PDP discharge cell described above is selected by confronting discharge between the address electrode 22 and the scanning/sustain electrode 14, and maintains the discharge by the surface discharge between the scanning/sustain electrode 14 and the common sustain electrode 16, which is a state of sustain discharge.

In the PDP discharge cell, the phosphors 28 emit light by the ultraviolet light generated during the sustain discharge to discharge visible light out of the cell. Accordingly, images are displayed on the PDP. In this case, the PDP controls the discharge duration, i.e. the number of times of sustain discharge according to the video data to realize the gray scale necessary for the image display.

In the 3-electrode AC surface discharge type PDP, the driving duration to express a specific gray level for one frame is divided into a plurality of sub-fields. In each of the sub-field durations, the light emission is generated with the number of times proportional to the weight value of the video data to express the gray level.

A general PDP is driven by an ADS (Address and Display Periode Separated) method wherein one frame is driven with divided into many subfields, each of which has a different discharge frequency to express the gray level of images as above.

For instance, in case of displaying images with 256 gray levels by using 8 bits of video data, the display duration (for instance, 1/60 sec.=about 16.7 msec.) for one frame in each discharge cell is divided into 8 subfields.

Each of the eight subfields is divided into again reset duration, address duration, and sustain duration. The sustain duration of each subfield is provided with a different time weight value at a rate of $2^N$ (here, N is 0, 1, 2, 3, ..., 7). The time weight value is increased at a rate of 1:2:4:8:16:128 from the first subfield upto the 8th subfield.

As described above, each subfield has a different sustain duration from each other to express the gray levels of images.

The reset duration is the duration to initialize the discharge cell, and the address duration is the duration to generate selective address discharge according to the logical sum of the video data, and the sustain duration is the duration to maintain the discharge in the discharge cell which the address discharge is generated in.

In the PDP, excessive amount of charged particles are generated in the discharge space due to a high voltage or a high temperature.

The phosphors are heated by the collision of the charged particles to leave a residual image on the display screen.

The residual image effect, as shown in FIG. 3, becomes more apparent since a window pattern of a portion 30A of the panel display surface 30 where the discharge is intensively generated to display an image. In other words, the residual image is generated since the window pattern, at a portion on the panel display surface 30 on which, when generating the discharge on the entire surface of the panel, the discharge was intensively generated.

In case of the PDP utilized as a TV or a bulletin board, when displaying a logo of a company or important words by using only a part of the entire surface of the PDP display screen, residual images are generated on the portion on which the logo or the words was located.

In addition, the residual image is seriously shown according to power change, that is, impedance change or surface physical property change of the protective layer 20.

In addition, the main reason that the residual image is generated in the conventional PDP is discharge error of clearance discharge due to the instable driving of the PDP. However, the problem is recently being solved as the clearance discharge is stabilized.

However, there are still many reasons to cause the residual image on the display screen of the PDP in the conventional arts.

SUMMARY OF THE INVENTION

Accordingly, the present invention is directed to a cooling apparatus of a plasma display panel and a method of stabilizing a panel that substantially obviate one or more problems due to limitations and disadvantages of the related art.

An object of the present invention is to provide a cooling apparatus of a plasma display panel and a method of stabilizing a panel that are suitable for minimizing the residual images on the screen caused by the degeneration of the phosphors due to a high voltage or a high temperature.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a cooling apparatus of a plasma display panel includes: a display panel; a printed circuit board (PCB) which a driving circuit of the panel on and which is installed at a rear side of the display panel; a case installed to enclose a rear side of the panel and the PCB, for protecting the panel and the PCB; and a plurality of cooling fans attached to the case so as to cool temperature of the display panel, and intensively installed at a portion where a residual image is periodically generated in the display panel.

Preferably, the case further comprises a plurality of air exhaust holes in a right rear direction and both side directions of the display panel so as to exhaust an air flow generated by an operation of the cooling fans.

Preferably, the display panel is installed spaced apart by an interval corresponding to 20% to 30% of a real thickness of the display panel from the PCB.

Preferably, the cooling fans are intensively installed at a portion where a logo or an important word is displayed on the display panel.

Preferably the cooling apparatus further includes a sink plate installed on the PCB of the rear side of the display panel to be spaced at a maximum interval within a height of the case from the PCB.

In another aspect of the present invention, there is provided a method for stabilizing a panel. The method includes: a first step of deciding a number of sustain pulses depending on luminance of an inputted video signal such that temperature of the panel is limited below a constant temperature; and a second step of supplying the decided number of the sustain pulses to display the inputted video signal.

Preferably, the first step decides the number of the sustain pulses depending on a variation in the luminance varied with the temperature.

Preferably, the first step reduces the number of the sustain pulses supplied to the panel when the luminance of the inputted video signal is over a constant value.

Preferably, the first and second steps reduces a supply power by placing a silent period at a mid-term of the sustain pulses supplied to the panel when the luminance of the input video signal is over a constant value.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Now hereinafter, the description of preferred embodiments of the present invention will be made with reference to FIGS. 4 to 17.

As described above, the residual image on the PDP is generated by the heating of the phosphors due to a high temperature and a high voltage In the present invention, the residual image phenomenon is reviewed with a variation in the power. The variation in the power, e.g., the impedance has an electrical resistance component, and thus, if the discharge area is changed, the impedance is normally changed, too.

The reasons for the PDP residual image phenomenon can be summarized roughly as two reasons. The first is the one generated due to the luminance difference. The second is the one generated due to the color coordinate.

Figure 1:
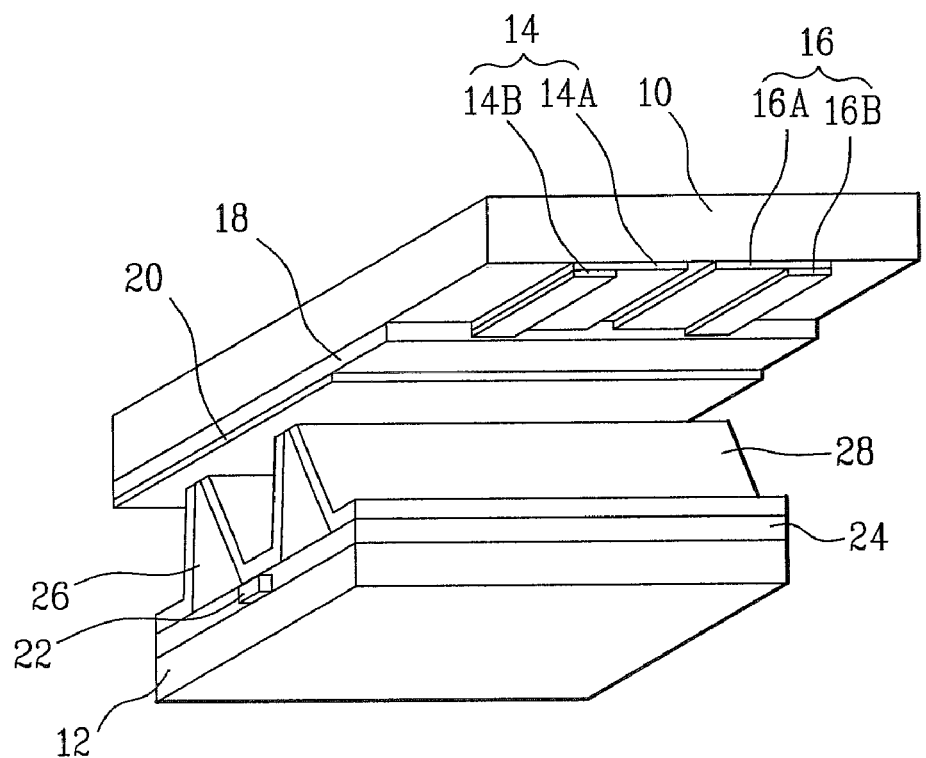
FIG. 1 is a perspective view of the discharge cell structure of a typical 3-electrode AC surface discharge type PDP (or AC PDP of surface discharge type having 3-electrode)
Figure 2:
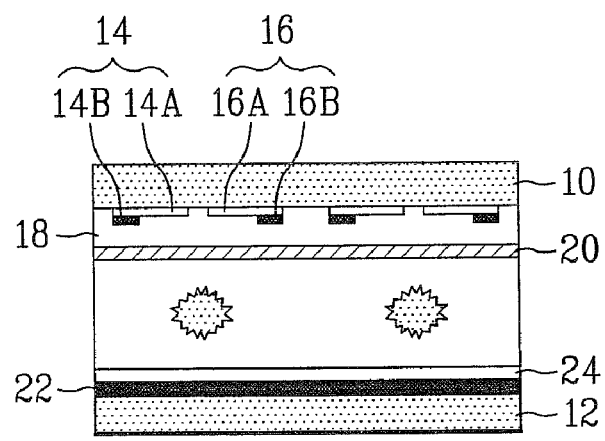
FIG. 2 is a sectional view of the PDP of FIG. 1.
Figure 3:
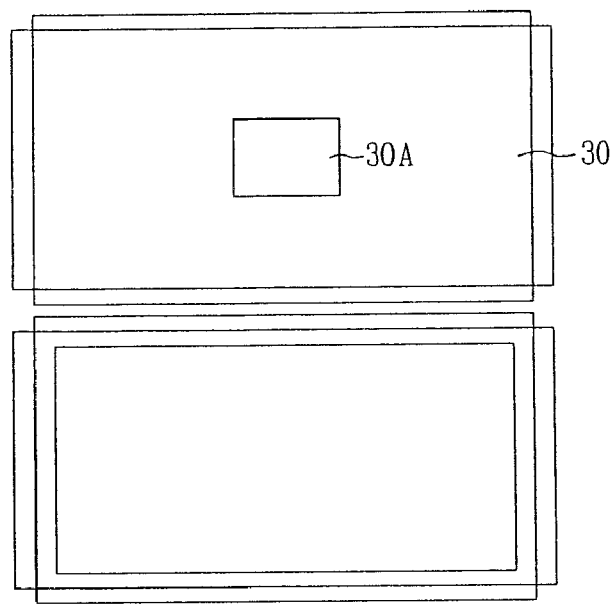
FIG. 3 is an exemplary schematic diagram depicting a residual image phenomenon on the plasma display panel according to the conventional art.
Figure 4A:
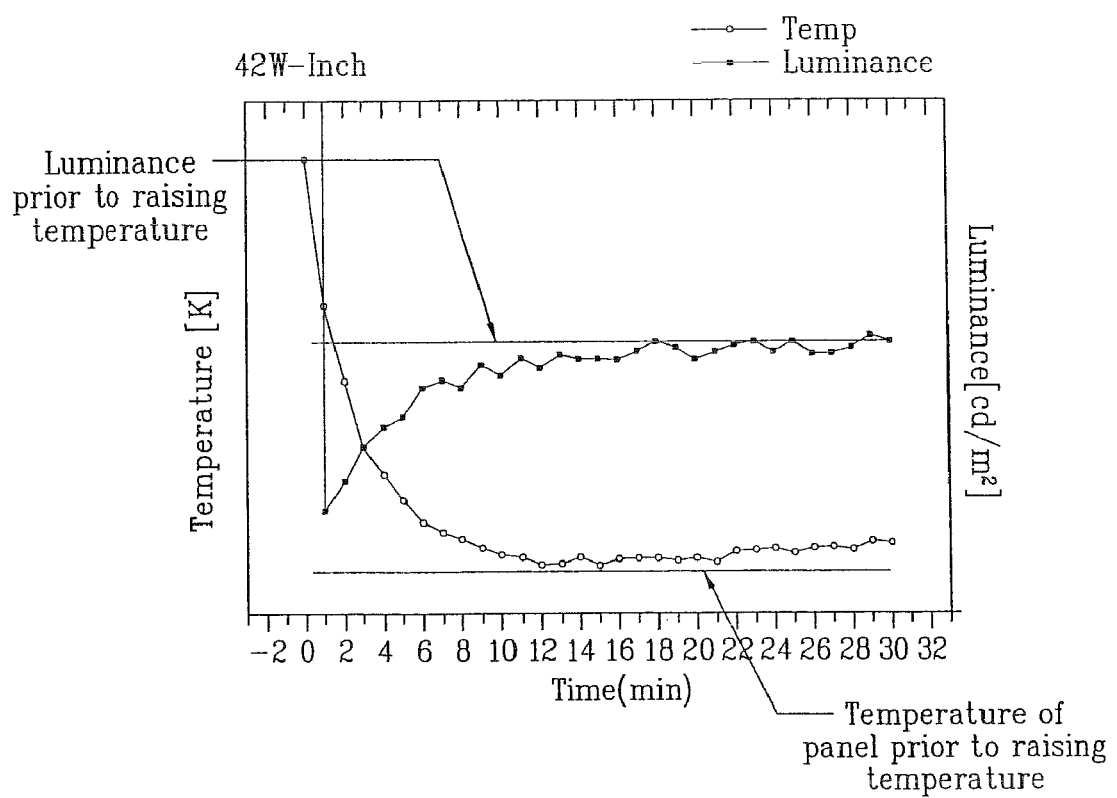
FIGS. 4A and 4B are graphs showing variations in luminance and color coordinate (CCx) depending on the temperature.
Figure 4B:
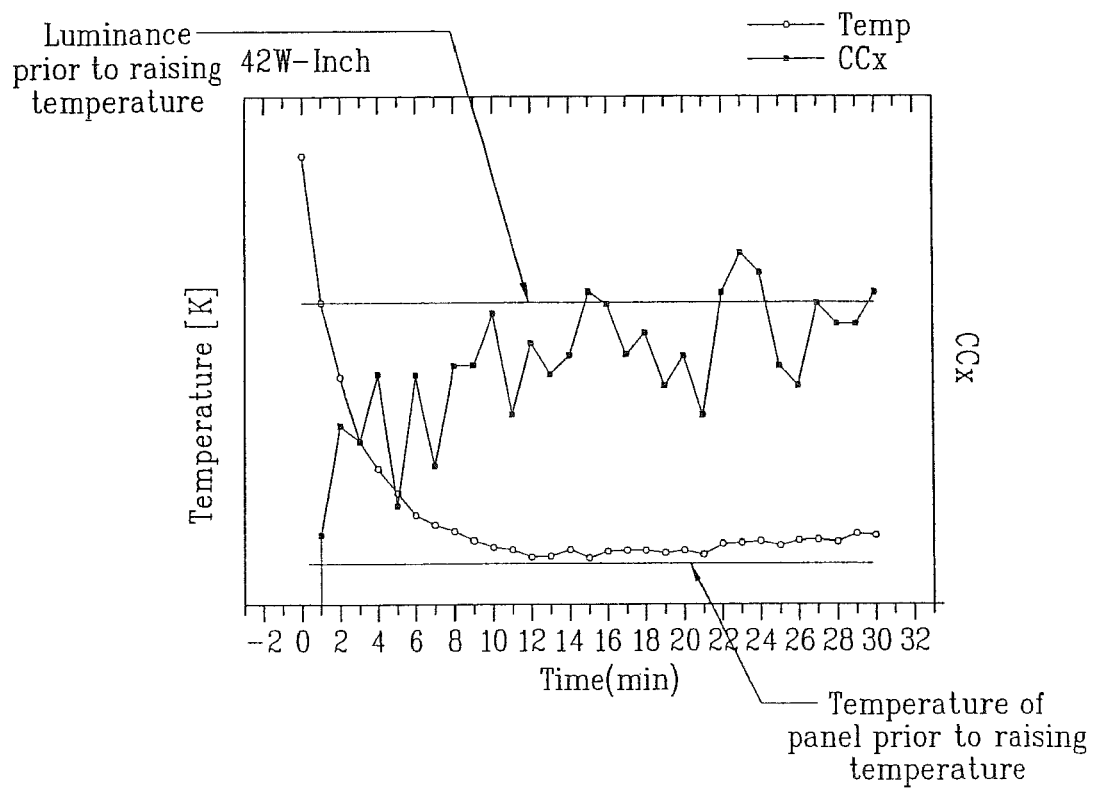

The residual image due to the luminance difference is related with temperature directly. In other words, the luminance and color coordinate (CCx) are varied with temperature as shown in FIGS. 4A and 4B.

For example, in 42 inches of the PDP, in view of variations in the luminance and the color coordinates depending on the temperature, and since the window pattern to cause intensively discharge on a part of the panel display surface displaying images, temperature is rapidly dropped and the luminance is also reduced.

After that, as temperature is gradually increased, luminance is increased, so that the PDP is maintained at a normal temperature and a normal luminance. At this time, the residual image duration is referred to as the time which takes to reach the normal temperature and the normal luminance since the window pattern.

Figure 5:
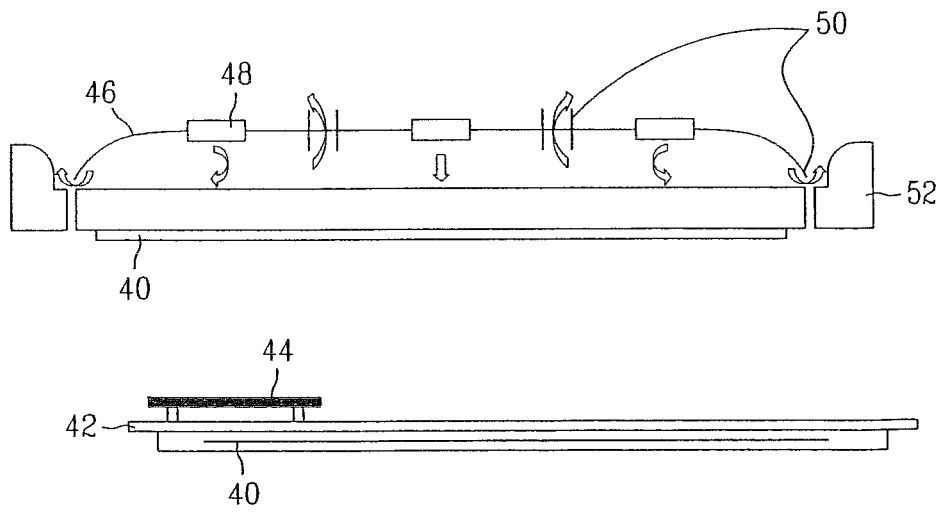
FIG. 5 illustrates a plasma display panel device according to one embodiment of the present invention.

Thus, since the residual image phenomenon is generated according to the temperature change, the increased temperature since the window pattern should be lowered down before a discharge to show a next image is generated in order to minimize the residual image. FIG. 5 shows an apparatus to solve the above problem.

FIG. 5 illustrates a cooling apparatus of the plasma display panel according to one embodiment of the present invention.

As shown in FIG. 5, the cooling apparatus includes a printed circuit board (referred to as PCB below) 42, a case 46 covering the back side of the PDP 40 and the PCB 42 to protect the PDP 40 and the PCB 42, a cooling fan 48 attached on the case 46, for cooling the temperature of the PDP 40 by cooling its inside, and an air exhaust hole 50 of exhausting the air inside the case 46 to the outside.

Since the PDP 40 has a discharge space in which a discharge gas is injected and that exists between the upper substrate having the sustain electrodes pair for sustain discharge and the lower substrate having the address electrode for address discharge, the PDP 40 emits the visible light having any one of red, green and blue colors by the generated discharge.

In case the PDP 40 is used as a TV or a bulletin board, in particular in case of expressing the logo of a company or important words by using only a part of the entire display surface of the PDP 40, a cooling fan 48 is installed to prevent the residual images from being generated at the portion of the logo or the words.

Figure 6:
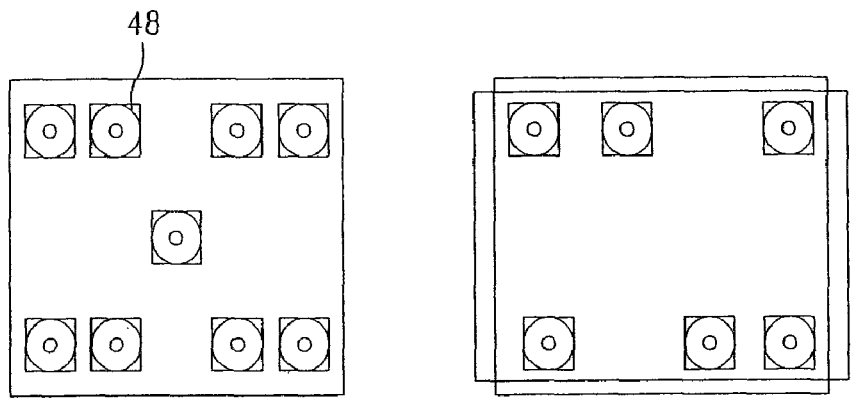
FIG. 6 is a schematic view of an exemplary arrangement of the cooling fans in the cooling device of FIG. 5.

The cooling fan 48 is placed at the portion of a high possibility which the residual image is generated. In other words, the cooling fans are installed especially on the portion where the logo of a company or important words is displayed and thus the residual image phenomenon is periodically and intensively generated. The installation example of the cooling fans 40 is shown in FIG. 6.

Resultantly, since it is possible to rapidly decrease the temperature of the specific portion where a residual image is displayed due to the display of a logo or important words using the cooling fan 48 of the present invention, the luminance difference due to temperature can be reduced.

The sink plate 44 is installed at the back side of the PDP 40, and the PCB 42 is installed on the sink plate 44. The interval between the PCB 42 and the sink plate 44 is spaced at maximum as possible. In other words, the interval between the PCB 42 and the sink plate 44 should be maximized as possible as within the height of the case 46 mounted at the rear side.

The interval between the PDP 40 and the PCB 42 should be 20~30% of the height of the PDP 40. For example, if the height of the PDP 40 is 10, the interval between the PDP 40 and the PCB 42 should be 2~3.

In the conventional case, the PCB and the PDP could not be installed with a sufficient interval therebetween. Therefore, even if cooling the inside of the case by installing the cooling fan, the cooled air could not sufficiently circulated.

However, according to the present invention, the interval between the PCB 42 and the sink plate 44, and the interval between the PDP 40 and the PCB 42 are maximized as possible as they are installed, so that the cooled air can be easily circulated inside the case 46.

The air exhaust hole 50 are formed in the right front and right rear directions and in the lateral sides directions. In other words, the plurality of air exhaust holes 50 are installed at the center of the case 46 and in the form of groove on the both sides on which speakers 52 are placed respectively. The air exhaust hole 50 discharges the heated air inside the case 46 to the outside of the case 46. In addition, the air flow by the cooling fans 48 is exhausted through the air exhaust hole 50.

With reference to the graphs in the drawings, there will be described for the fact that the residual image phenomenon is reduced by using the cooling apparatus of the present invention.

Figure 7A:
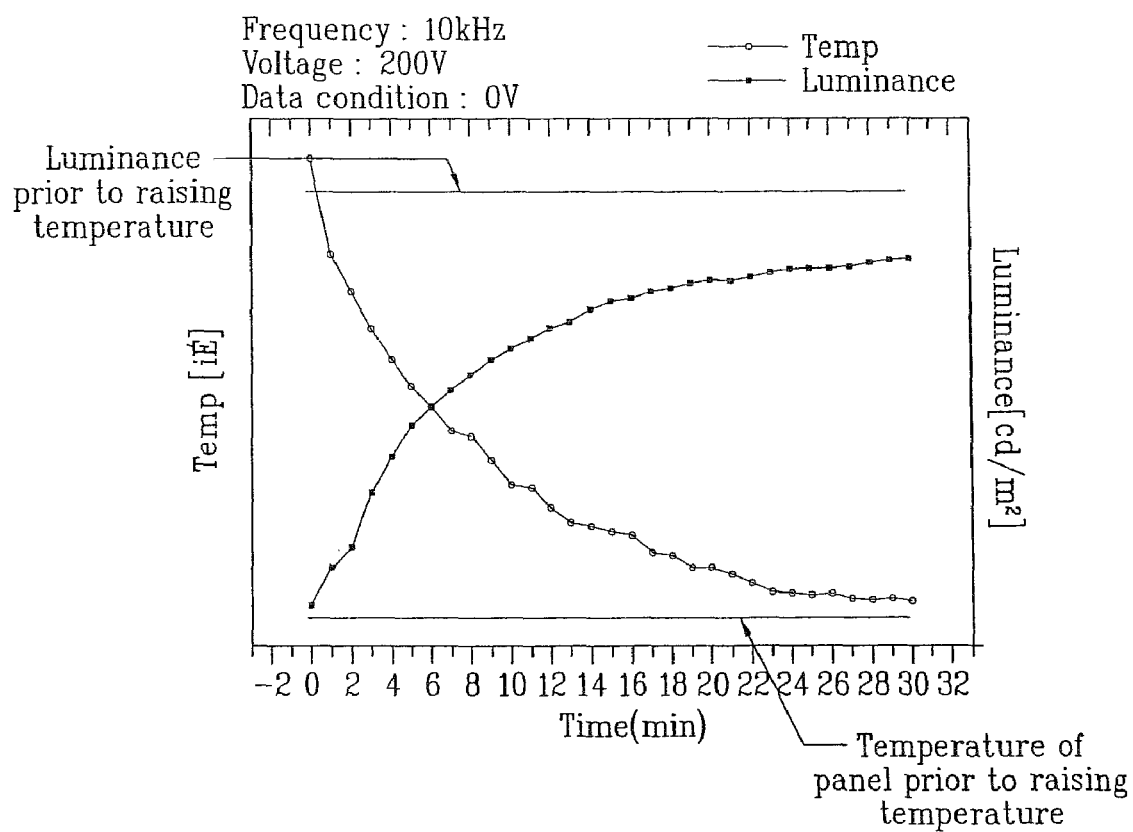
FIGS. 7A and 7B are graphs showing variations in the luminance depending on temperature.
Figure 7B:
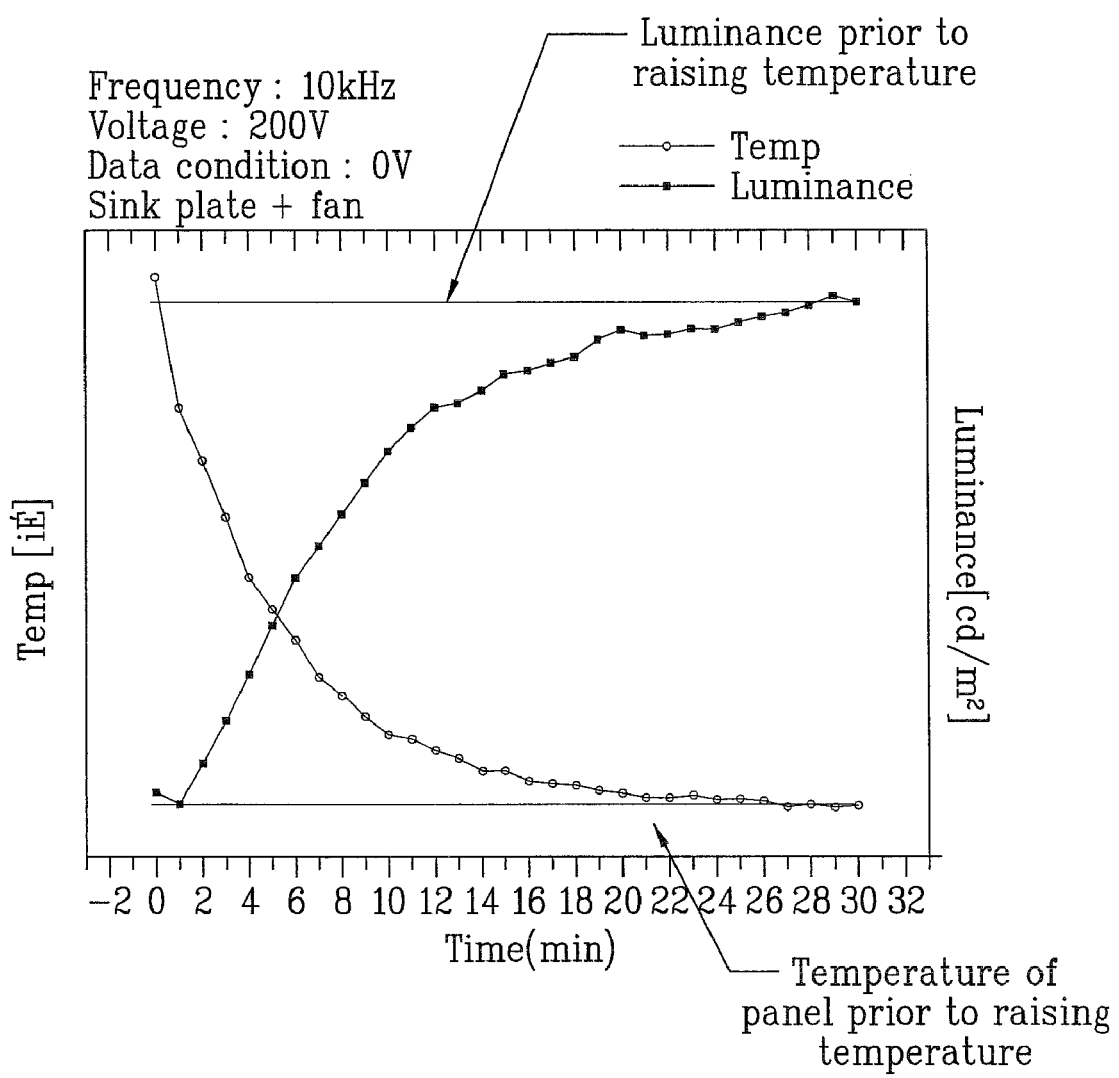

FIGS. 7A and 7B are graphs showing variations of the luminance with temperature. Specifically, FIG. 7A is a graph showing the variation of the luminance with the temperature of the conventional PDP, and FIG. 7B is a graph showing the variation of the luminance with the temperature of the PDP provided with a cooling apparatus according to the present invention.

As shown in FIGS. 7A and 7B, the temperature, which was rapidly increased since the window pattern, is gradually decreased, so that the luminance is increased.

As shown in FIG. 7B, in the PDP having the cooling apparatus installed therein according to the present invention, the luminance curve returns to a normal luminance curve within a faster time than in the graph of FIG. 7A. This means that the decrease in the temperature of the PDP using the cooling apparatus of the present invention enables to reduce the duration of residual image.

The variation of the color coordinate with the temperature is reviewed.

Figure 8A:
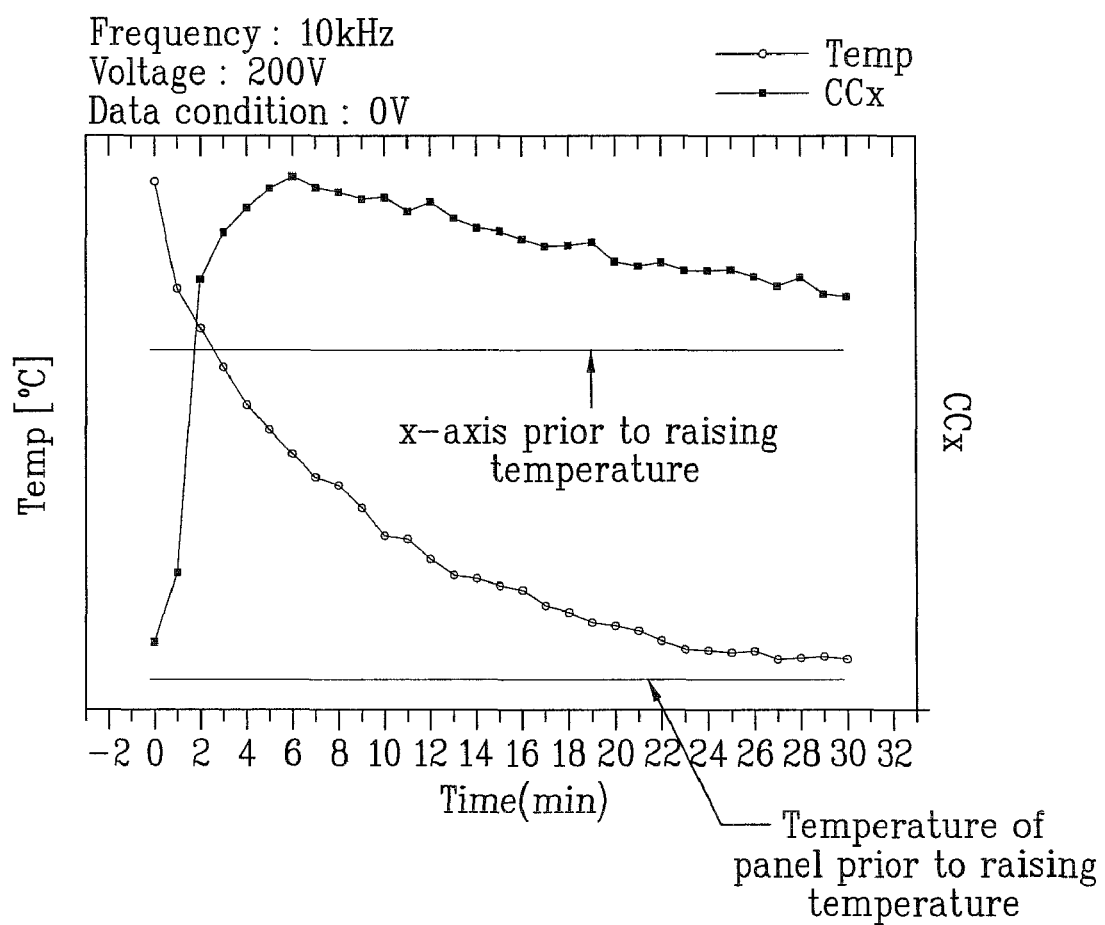
FIGS. 8A and 8B are graphs showing a variation in color coordinates depending on temperature.
Figure 8B:
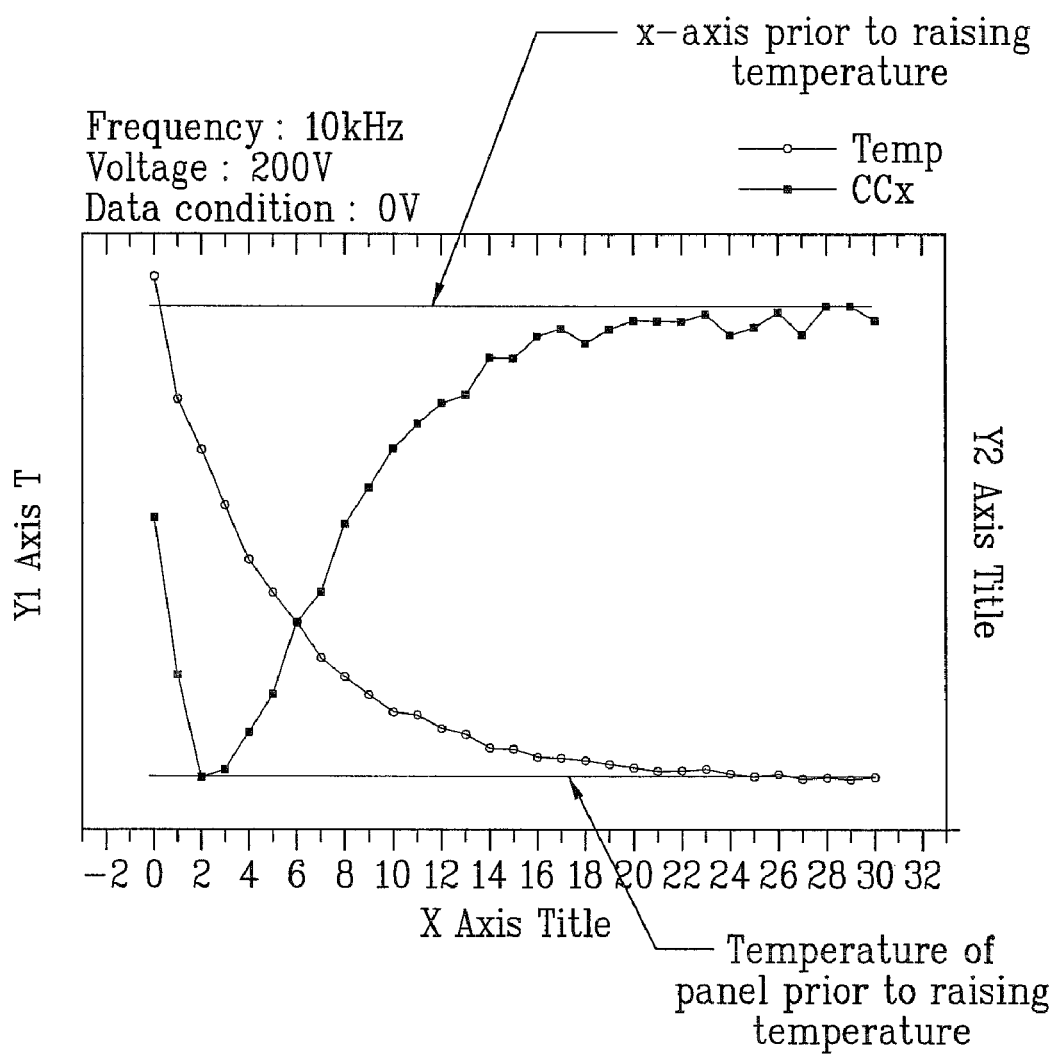

FIGS. 8A and 8B are graphs showing a variation in color coordinates depending on temperature. Specifically, FIG. 8A is a graph showing a variation in the color coordinate with the temperature of the conventional PDP, and FIG. 8B is a graph showing a variation in the color coordinate with the temperature of the PDP provided with a cooling apparatus according to the present invention. Here, the color coordinate represents only x-axis.

As shown in FIGS. 8A and 8B, as the temperature which was raised rapidly since the window pattern is gradually decreased, and the color coordinates returns to the original color coordinate.

As shown in FIG. 8b, in the PDP having the cooling apparatus of the present invention, the color coordinate is turned back to the normal state within the faster time than in the graph of FIG. 8A. This means that the restoring time of the color coordinate is faster than that in the conventional one by cooling the temperature of the PDP using the cooling apparatus of the present invention. In other words, it shows that the duration of the residual image can be reduced.

Figure 9A:
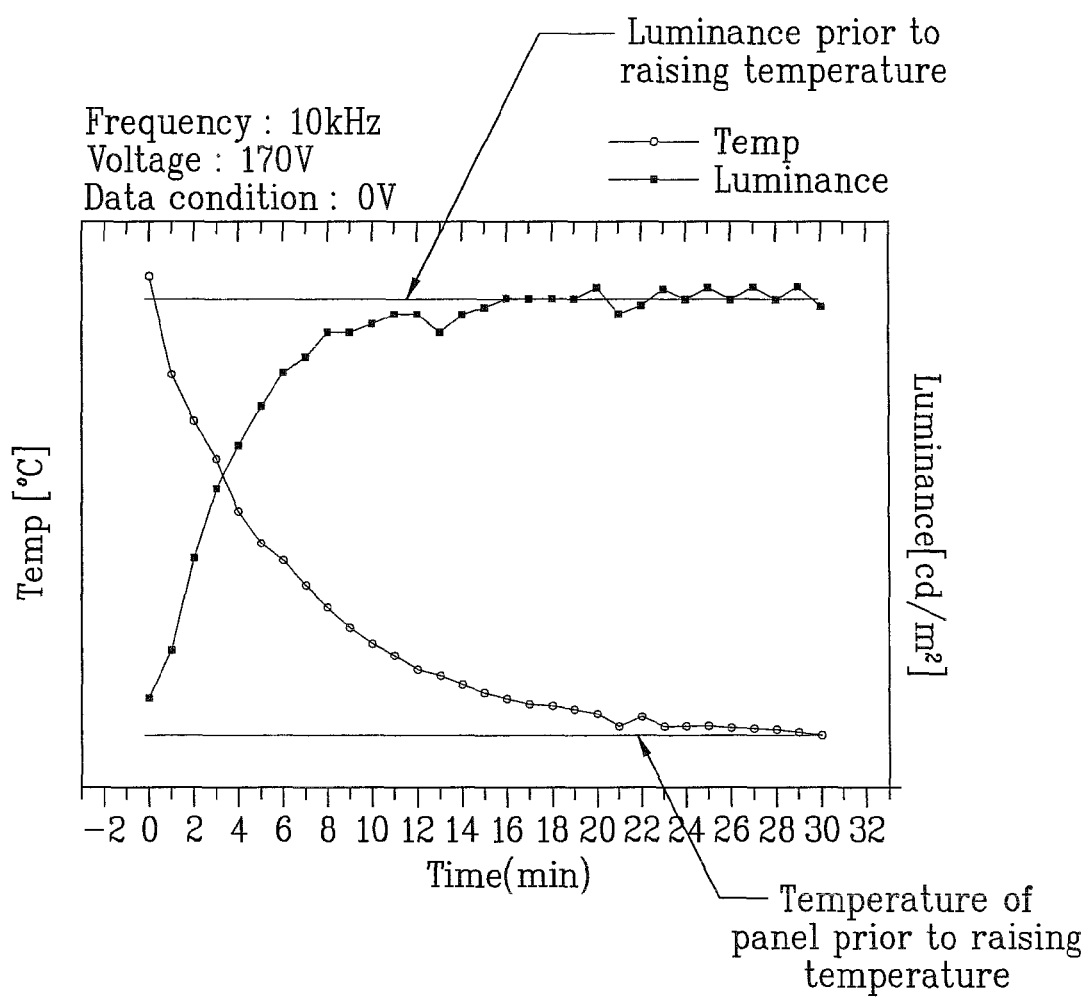
FIGS. 9A and 9B are graphs showing a variation in the luminance depending on discharge voltage.
Figure 9B:
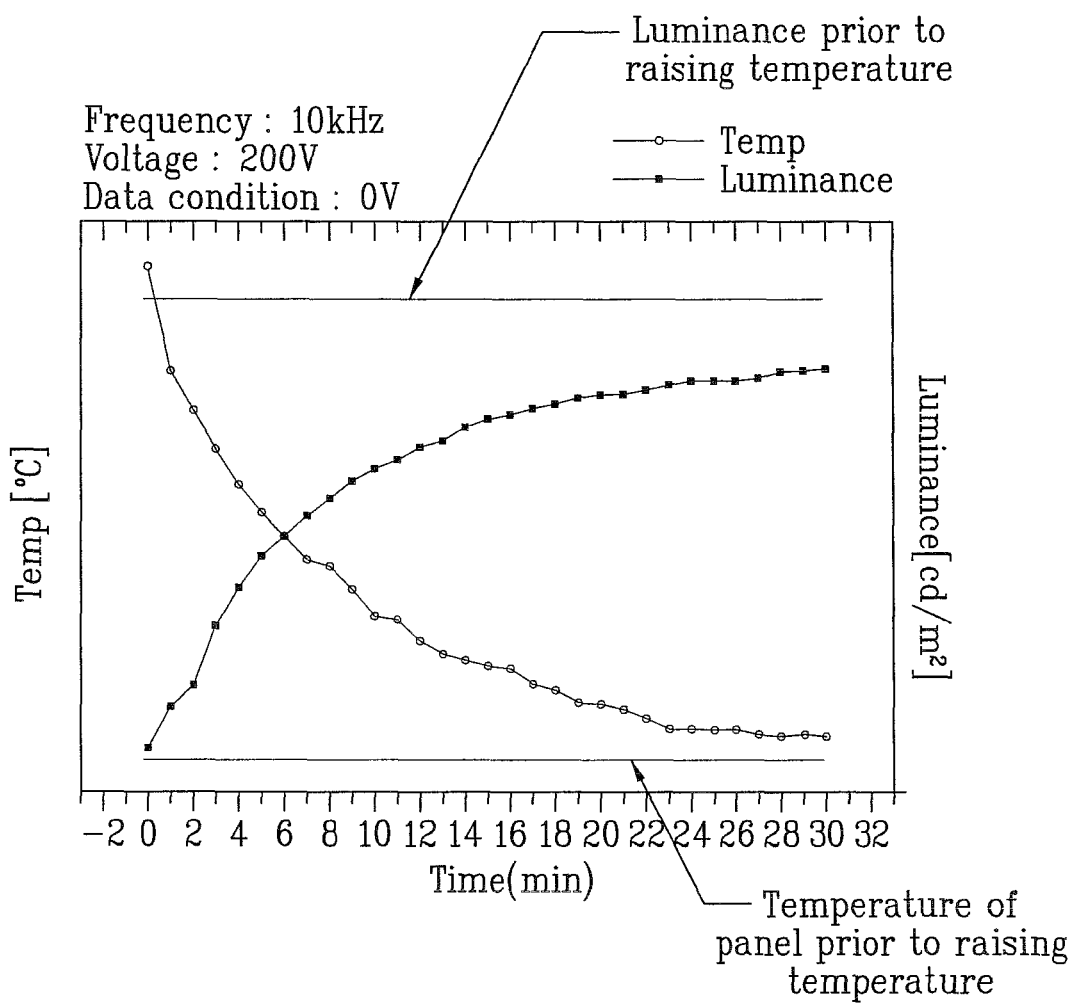
Figure 10A:
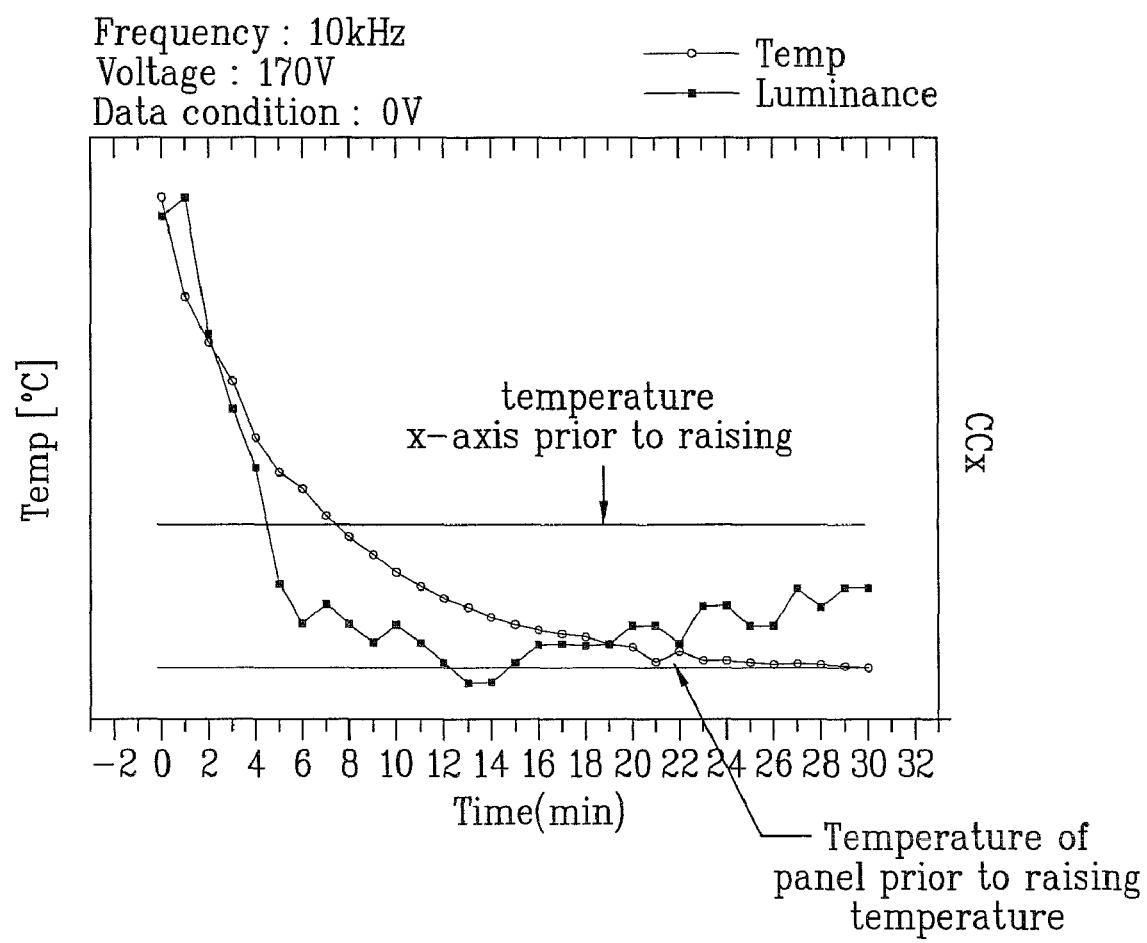
FIGS. 10A and 10B are graphs showing a variation in the color coordinates depending on discharge voltage.
Figure 10B:
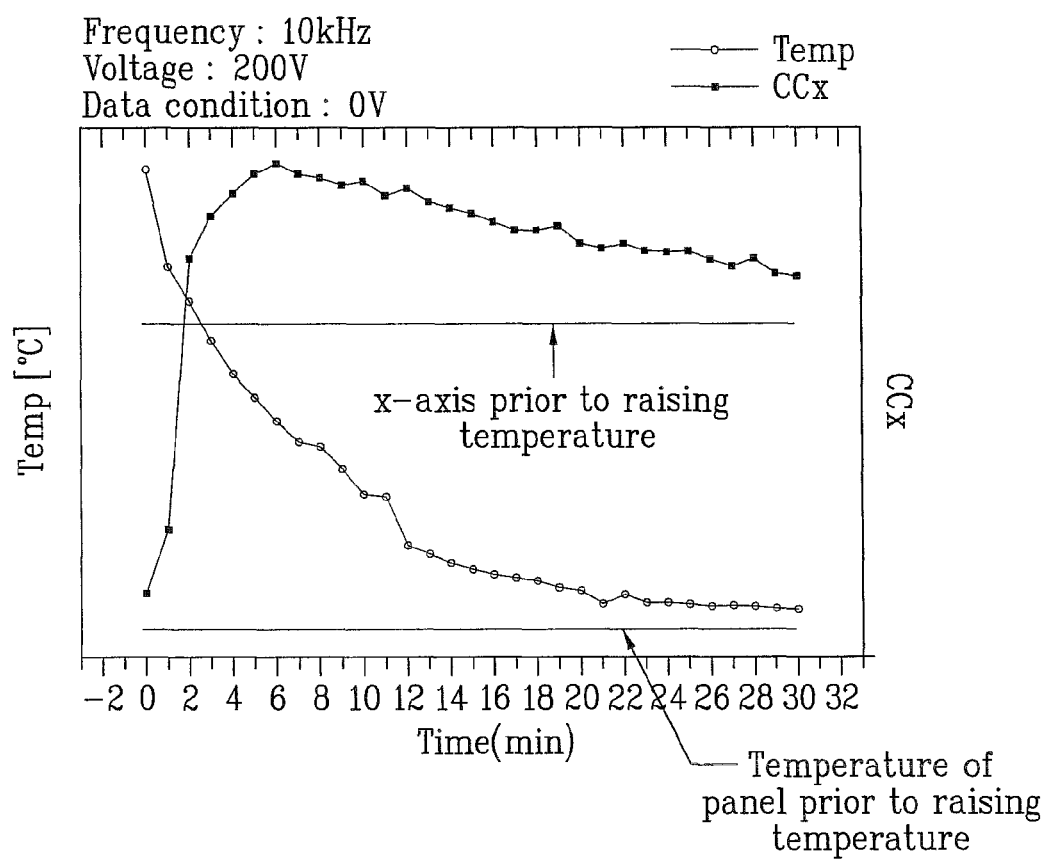

FIGS. 9A and 9B are graphs showing a variation in the luminance with discharge voltage, and FIGS. 10A and 10B are graphs showing a variation in the color coordinates depending on discharge voltage.

Voltage is proportional to the discharge area. To this end, as the voltage is increased, the temperature is increased, so that the duration of the residual image is increased.

Specifically, FIG. 9A is a graph showing the variation of the luminance with a variation of a discharge voltage, 170 V, and FIG. 9B is a graph showing the variation of the luminance with a variation of a discharge voltage, 200 V.

FIGS. 9A and 9B show the variations of the luminance with the voltage when the temperature arbitrarily raised is decreased.

As the raised temperature is gradually decreased to balance the inside temperature, the decreased temperature is increased. However, when comparing FIG. 9A of when a discharge voltage of 200 V is supplied with FIG. 9B of when a discharge voltage of 170 V is supplied, the speed that the luminance is turned back to the original state is slower in FIG. 9A of the discharge voltage of 170 V than in FIG. 9B of the discharge voltage of 200 V. By this, it is known that as the voltage is increased, the duration of the residual image is increased.

FIG. 10A is a graph showing the variation of the color coordinate under a discharge voltage of 170 V, and FIG. 10B is a graph showing the variation of the color coordinate under a discharge voltage of 200 V.

FIGS. 10A and 10B show that the color coordinate (especially, x-axis) is turned back to the normal state depending on voltages as the temperature of the PDP raised arbitrarily is gradually decreased.

As the increased temperature is gradually decreased to balance the inner temperature, the color coordinate is turned back to the normal state.

However, when comparing FIG. 10A with FIG. 10B, the speed that the color coordinate is turned back to the normal state is slower in FIG. 10A of the discharge voltage of 170 V than in FIG. 10B of the discharge voltage of 200 V. By this, it is known that as the voltage is increased, the duration of the residual image is increased. When considering that voltage is proportional to power, it is known that as the power is increased, the duration of the residual image is increased.

In view of the results, why the duration of the residual image is increased with the increase of the voltage is that as the voltage is increased, the temperature is increased, and overpower degenerates the phosphors faster.

Therefore, the present invention restricts the number of the voltage pulses which is supplied for sustain discharge such that the temperature is always maintained below a predetermined degree to minimize the residual image. A detailed description on this will be made as follows.

Figure 11:
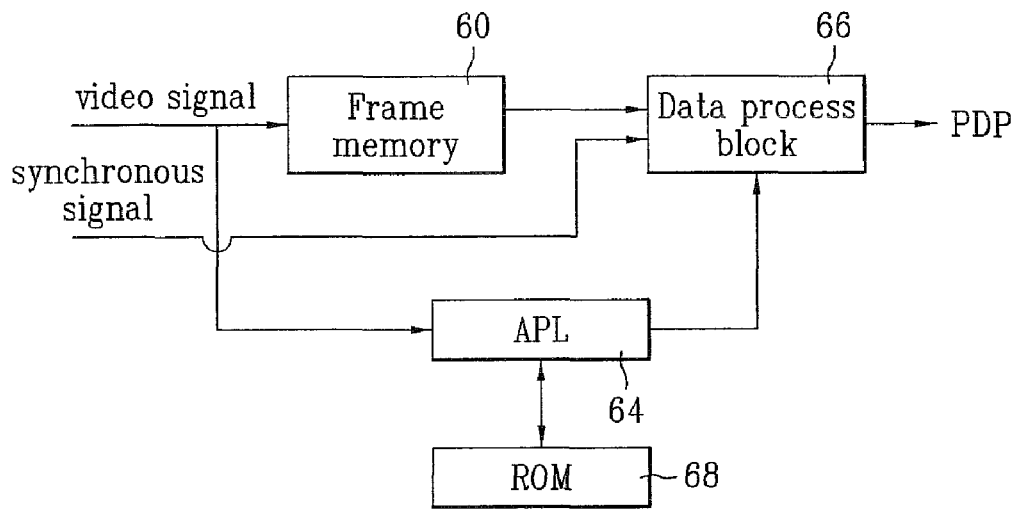
FIG. 11 is a block diagram of a circuit structure for the power control of the present invention.

FIG. 11 is a block diagram of a circuit structure for the power control of the present invention.

Referring to FIG. 11, a circuit for controlling power of a PDP according to the present invention includes a frame memory 60 for storing a video signal, an APL (Auto Power Limit) 64 for controlling the power for the video signal, a ROM 68 for storing various data values depending on the variation of the temperature, and a data process block 66 for synchronizing the outputs of the power of the frame memory 60 and the APL 64 and outputting the synchronized output to the PDP.

The circuit for power control determines the number of the sustain pulses depending on the luminance of the input video signal such that the temperature of the PDP is limited below a predetermined temperature, and is provided for supplying the number of the decided sustain pulses to display the input video signal.

The power control circuit is in charge of the power control for the panel driving circuit (not shown) to display the input video signal.

The frame memory 60 temporarily stores the input video signal in a unit of frame. Therefore, the frame memory 60 is designed to have a storage capacitance as high as that of the video frame.

The APL 64 determines the limit width of the supplied power for the input video signal. To achieve this, the APL 64 controls the number of the sustain pulses supplied to maintain a constant power consumption every video frame regardless of discharge cell to be turned on.

The APL 64 refers the data value stored in the ROM 68 to maintain a constant power consumption every input video frame. That is, the APL 64 extracts data values on power consumption, luminance or color coordinate according to the temperature variation stored in the ROM 68, and outputs the extracted data values to the data process block 66. The extracted data values are the values to be used for the currently input video frame.

The data process block 66 synchronizes the outputs of the frame memory 60 and the APL 64 with the input synchronization signal, and outputs a synchronized signal to the PDP. Especially, the data process block 68 corrects the gain and error for the signal outputted to the PDP.

The ROM 68 stores the data values on the power consumption, luminance and color coordinate according to the temperature variation, and is designed as a lookup table on which the data values according to the temperature variations are arranged.

Hereinafter, operation of the aperture of the present invention will be described in detail with focused on the APL 64. The APL 64 supplies the APL set value to the data process block 66.

When a total area of the panel is supposed as 100, the area of a part intensively causing discharge by the window panel is 4 at maximum.

Since the discharge area due to the window pattern is smaller than the total area of the panel, the current flowing through the discharge area of the window pattern is relatively small, and the consumed power is decreased accordingly.

According to the present invention, the APL 64 is operated such that the consumed power is constant before or since the window pattern.

The power consumed per video frame corresponds to a product of an average luminance of one frame and the number of the sustain pulses of one frame.

As the discharge area is increased, the overall luminance is decreased and accordingly the number of the sustain pulses for the sustain discharge is increased. In order to maintain a constant power consumption every video frame, the APL 64 controls the number of the supplied sustain pulses regardless of the discharge cell to be turned on.

Figure 12:
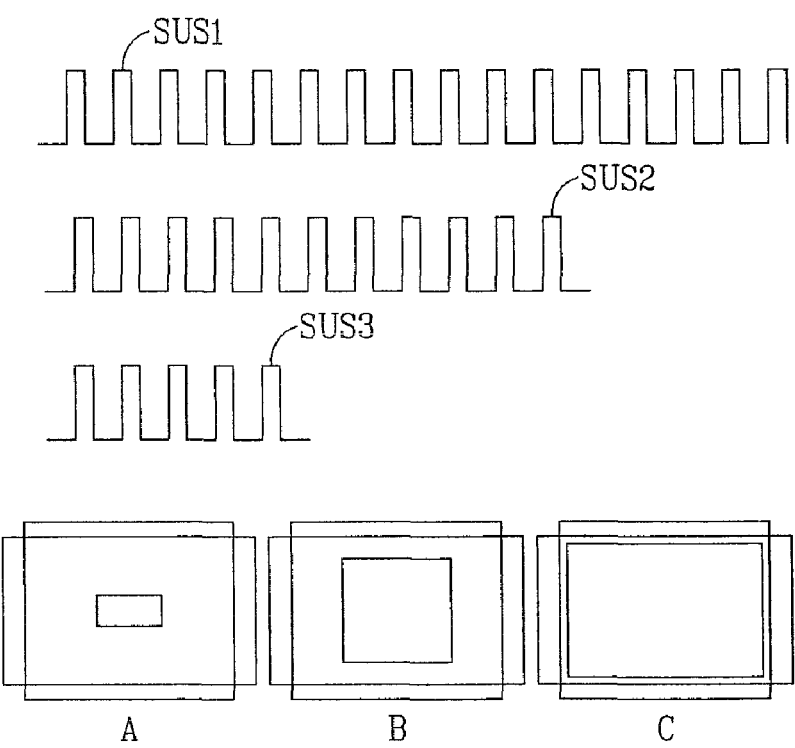
FIG. 12 exemplarily illustrates the number of the sustain pulses applied according to different discharge areas according to the present invention.

FIG. 12 exemplarily illustrates the number of the sustain pulses supplied according to different discharge areas according to the present invention. As shown in FIG. 12, when the discharge area is increased, the APL 64 controls the number of the sustain pulses to be decreased.

In other words, as shown in FIG. 12, if the discharge areas of A, B and C have a relation of A<B<C, the number of the sustain pulses supplied for the sustain discharge with respect to each discharge area is set to have a relation of SUS1 >SUS2>SUS3.

Since the discharge area of the window pattern is smaller than the overall area of the panel, it is requested that the number of the sustain pulses per each discharge cell in the window pattern be larger than the number of the sustain pulses per each discharge cell that is supplied to the overall discharge area of the panel so as to the power consumption is maintained at the same level as the power consumption with respect to the overall area of the panel.

The power consumption is larger in the window pattern than in the overall discharge area of the panel. This means that a power is intensively consumed at a portion where discharge is intensively generated due to the window pattern.

The large power consumption means that the possibility on the acceleration of the degeneration of the phosphors is as high as the large power consumption.

In case the duration of the window pattern is maintained for a long term, the luminance difference is restored fast. However, if the duration of the window pattern is maintained longer and thus the degeneration of the phosphors is accelerated, it is not easy to restore the color coordinate.

In real circumstance, if the power consumption is large, the luminance difference may be restored depending on the duration of the window pattern, but it is not easy to restore the color coordinate.

So, temperature as well as luminance, color coordinate and current is additionally considered as the set value of the APL 64 according to the present invention. Accordingly, the number of the sustain pulses is limited by the set value of the APL 64 in which the temperature is additionally considered.

Figure 13A:
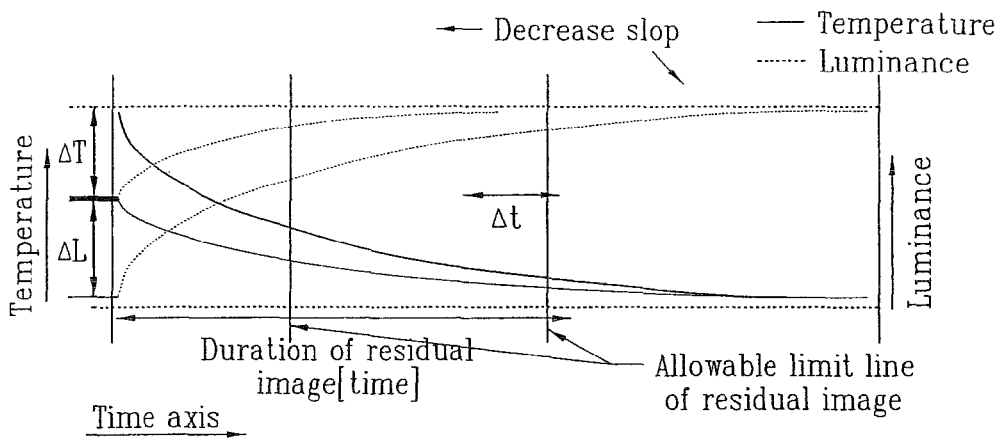
FIG. 13 is a graph showing a variation in the duration of the residual image depending on temperature and duration of the window pattern.
Figure 13B:
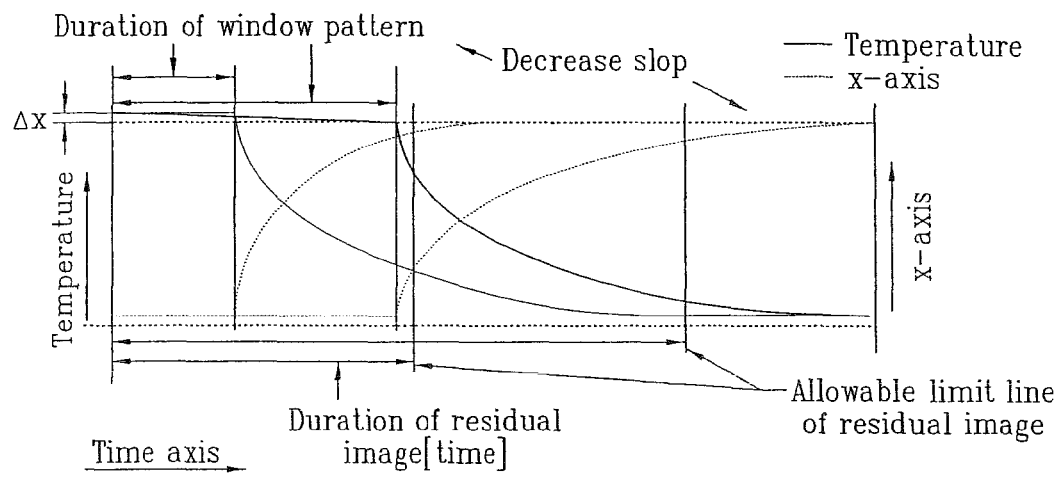
Figure 13C:
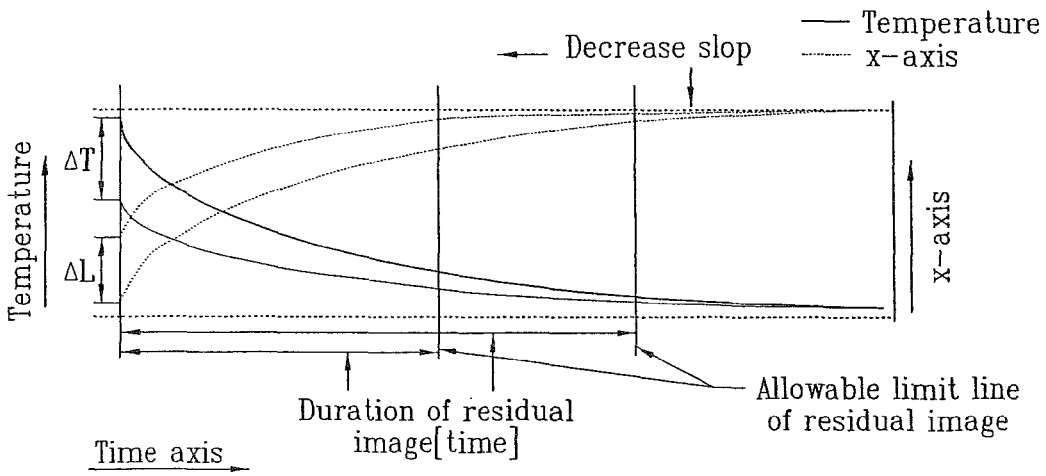
Figure 14A:
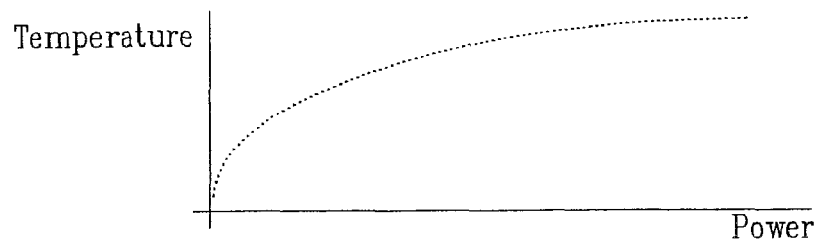
FIG. 14 is a graph showing variations in the luminance and the color coordinates depending on power and time.
Figure 14B:
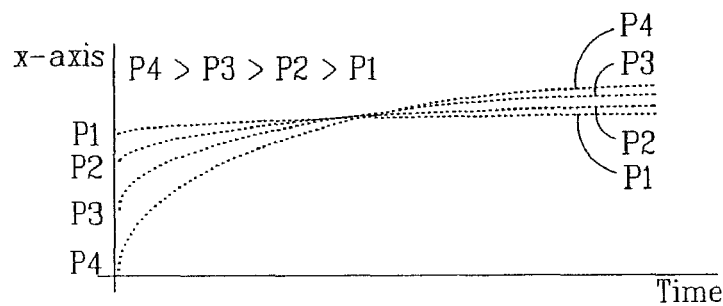

FIG. 13 is a graph showing a variation in the duration of the residual image depending on temperature and duration of the window pattern, and FIG. 14 is a graph showing variations in the luminance and the color coordinates depending on power and time.

As shown in FIGS. 13 and 14, the characteristics of the luminance and the color coordinate with the variation of the temperature are examined to standardize the temperature of when the power is generated and to apply the standardized temperature to the set value of the APL 64.

Figure 15:
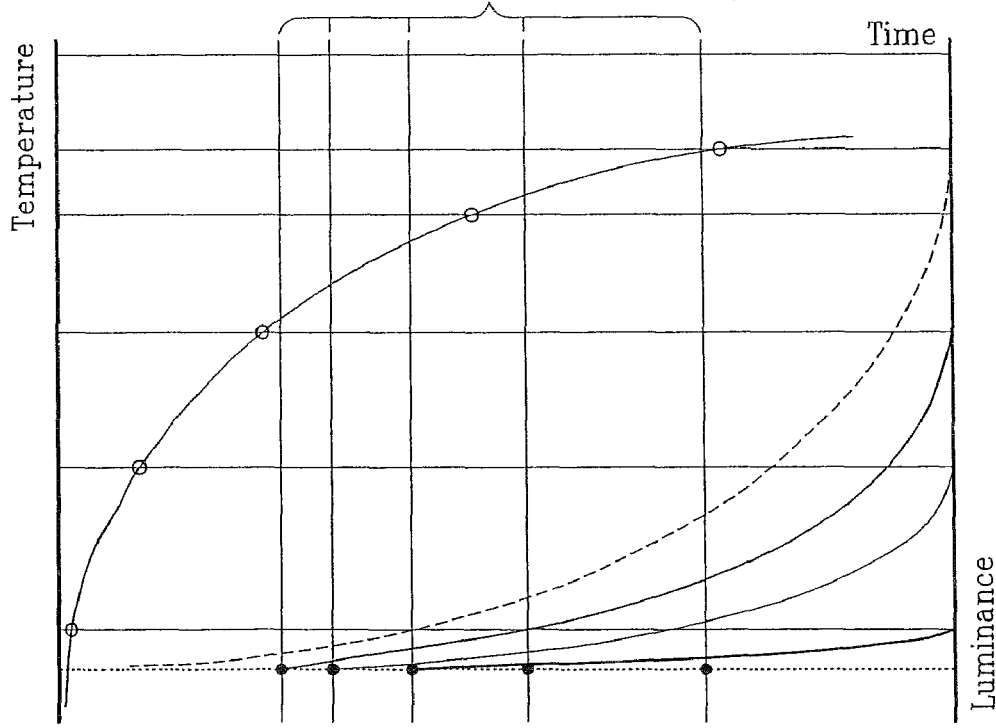
FIG. 15 is a graph showing relations between power, temperature, luminance and time according to the present invention.

FIG. 15 is a graph showing relations between power, temperature, luminance and time according to the present invention. As shown in FIG. 15, the duration of the residual image on the standardized temperature is also standardized, and a temperature component is added to be matched within an allowable time of the residual image when the value of the APL 64 is set.

Thus, by adding the standardized temperature factor upon setting the value of the APL 64, the number of the sustain pulses for the sustain discharge is limited.

Figure 16A:
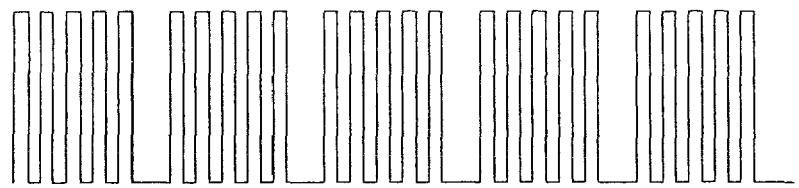
FIG. 16 exemplarily illustrates to restrict the number of the sustain pulses during the allowance time of residual image.
Figure 16B:
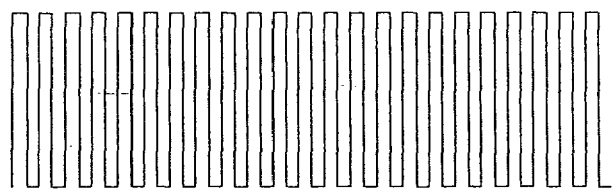

FIG. 16 exemplarily illustrates to restrict the number of the sustain pulses during the allowance time of residual image. As shown in FIG. 16, the number of the sustain pulses for the sustain discharge is reduced within the allowable time of the residual image, or the number of the supplied sustain pulses is reduced by placing a silent period at a mid-term of the sustain pulses.

Figure 17:
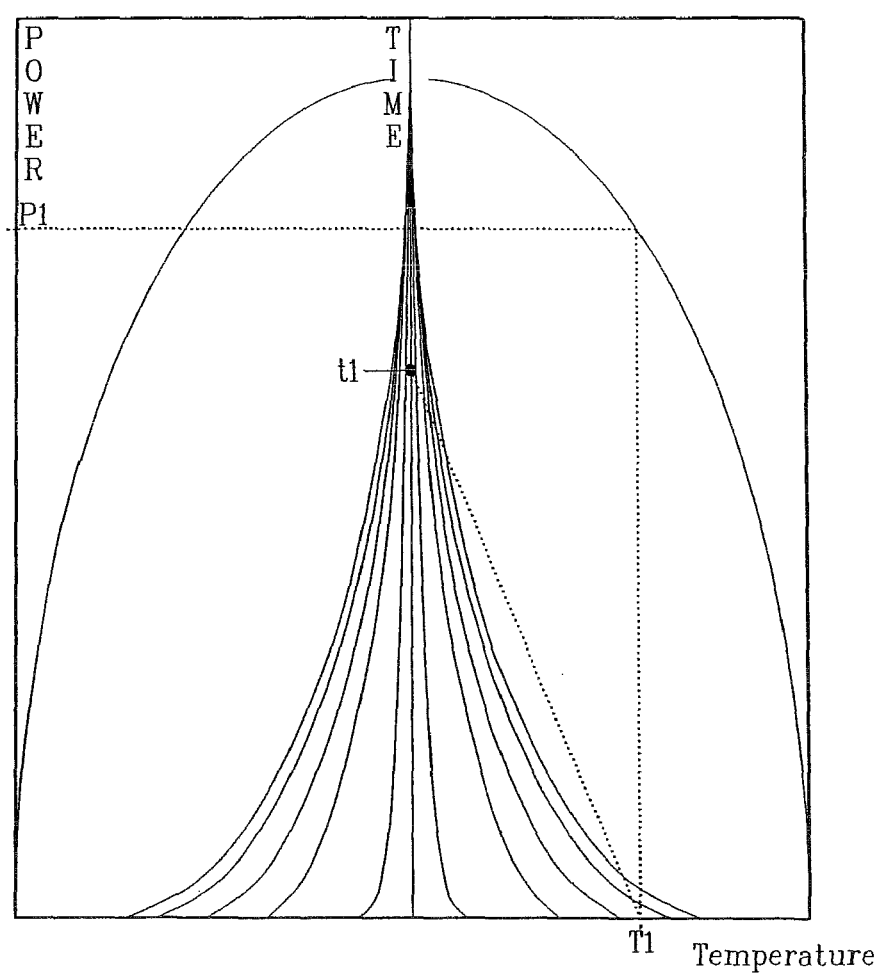
FIG. 17 is a graph showing variations in the temperature and the residual image duration time depending on the power according to the present invention.

FIG. 17 is a graph showing variations in the temperature and the residual image duration time depending on the power according to the present invention. As shown in FIG. 17, the temperature and the allowable time of the residual image depending on the standardized power are made in a chart structure to limit the power on the video signal and at the same time to enable to set the residual time in a range within a standard scale.

For instance, in case the power is selected as P1 as shown in FIG. 17, the temperature of the panel is T1 and the residual time is t1.

The color coordinate is not dependent only on the temperature characteristic, but it has a different depending on how long the window pattern is maintained.

Accordingly, in order to set the residual time depending on the color coordinate, there is added an item on how long the discharge is maintained using the window pattern.

As aforementioned, in case the window pattern is maintained for a long time, the PDP according to the present invention places a silent period to prevent the degeneration of the phosphors and thus to minimize the destroy of the color coordinate, and also limits the time to control the power depending on the time.

As described previously, since a PDP according to the present invention can rapidly decrease the temperature at a specific location where a residual image is generated when it is used for a monitor, a TV or a bulletin board, it is possible to restore the luminance difference due to the temperature within a short time. As a result, a residual image generated by the degeneration of the phosphors due to a high temperature is minimized.

Also, the temperature and the allowable time according to the power are standardized, thereby restraining the degeneration of the phosphors and preventing the generation of the residual image.

Further, the destroy of the color coordinate (movement of coordinate) is minimized, thereby rapidly restoring the color coordinate to its normal location and at the same time decreasing the residual image due to the window pattern for a long time.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus that controls power of a display panel, the apparatus comprising:
   a memory that receives and stores a video signal;
   a ROM that receives and stores data including a luminance and color coordinate based on temperature variation; and
   an Auto Power Limit (APL) that controls power for the video signal based on data stored in the ROM.

2. The apparatus of claim 1, wherein the memory stores a limit associated with a window pattern displayed on the panel which results in an allowable duration of a residual image.

3. The apparatus of claim 1, wherein the APL reduces a number of sustain pulses by placing at least one silent period at a mid-term of a plurality of sustain pulses supplied to the panel.

4. The apparatus of claim 3, wherein at least two silent periods are placed at the mid-term of the plurality of sustain pulses supplied to the panel.

5. The apparatus of claim 4, wherein each of the at least two silent periods comprises a predetermined interval.

6. The apparatus of claim 1, further including a data process block that synchronizes outputs of the power of the memory and the APL, and that outputs the synchronized output to the panel.

7. The apparatus of claim 6, wherein at least one of the memory, the APL, the ROM, or the data process block are embodied in a chip.

8. An apparatus for driving a panel that displays grey levels of inputted video signal, the apparatus comprising:
   a power controller that determines an allowable duration of a residual image based on a luminance value and a color coordinate value of the panel with a temperature variation, and reduces a number of sustain pulses supplied to the panel if a temperature of the panel exceeds a temperature range that is determined based on the allowable duration of the residual image.

9. A cooling apparatus for a plasma display panel, the apparatus comprising:
   a cooling device that determines an allowable duration of a residual image based on a luminance value and a color coordinate value of the panel with a temperature variation, and reduces a number of sustain pulses supplied to a panel if a temperature of the panel exceeds a temperature range that is determined based on the allowable duration of the residual image.

10. A method of driving a panel that displays gray levels of an inputted video signal, the method comprising:
    determining an allowable duration of a residual image based on a luminance value and color coordinate value of the panel with a temperature variation; and
    reducing driving current supplied to the panel if a temperature of the panel exceeds a temperature range that is determined based on the allowable duration of the residual image.

11. The method of claim 10, wherein reducing a driving current supplied to the panel comprises placing at least one silent period at a mid-point of an interval during which the driving current is applied to the panel.

12. The method of claim 11, wherein the silent period comprises a predetermined interval.

13. The method of claim 10, wherein determining a temperature range of the panel comprises determining the temperature range of the panel based on duration of a window pattern displayed on the panel.

14. The method of claim 13, wherein the window pattern comprises an image displayed at a high luminance level within a predetermined region of the panel.

15. The method of claim 13, wherein the window pattern comprises a logo.

16. The method of claim 13, wherein the window pattern is displayed within approximately 4% of a full display area of the panel.

17. A method for driving a panel that displays gray levels of an inputted video signal, the method comprising:
    determining an allowable duration of a residual image based on a luminance and a characteristic of phosphors of the panel with a variation of temperature; and
    reducing a number of sustain pulses supplied to the panel if a temperature of the panel exceeds a temperature range that is determined based on the allowable duration of a residual image.

18. A method for driving a panel that displays gray levels of an inputted video signal, the method comprising:
    determining an allowable duration of a pattern displayed on the panel based on a luminance and a color coordinate of the panel with a temperature variation; and
    reducing a number of sustain pulses applied to the panel if a temperature of the panel exceeds a temperature range that is determined based on the allowable duration of the pattern.

* * * * *